United States Patent [19]

Stewart et al.

[11] Patent Number: 4,588,674
[45] Date of Patent: May 13, 1986

[54] LASER IMAGING MATERIALS COMPRISING CARBON BLACK IN OVERLAYER

[76] Inventors: Malcolm J. Stewart, 14 Ashley Pl., Ramsbury, Marlborough, Wiltshire; Andrew Hudson, The Fish House, Cokethorpe, Witney, Oxfordshire; Peter W. Griffiths, 1 Grove Road, Wantage, Oxfordshire, all of England

[21] Appl. No.: 541,734

[22] Filed: Oct. 13, 1983

[30] Foreign Application Priority Data

Oct. 14, 1982 [GB] United Kingdom ............... 8229456

[51] Int. Cl.$^4$ ............... G03C 1/72; G03F 7/26; G01D 9/00
[52] U.S. Cl. ............... 430/273; 430/201; 430/346; 430/964; 346/135.1; 346/76 L
[58] Field of Search ............... 430/200, 201, 964, 945, 430/273, 346; 346/76 L, 135.1

[56] References Cited

U.S. PATENT DOCUMENTS

| | | | |
|---|---|---|---|
| 2,964,867 | 12/1960 | Kingsley | 346/135.1 |
| 3,787,210 | 1/1974 | Roberts | 430/945 |
| 3,962,513 | 6/1976 | Eames | 430/945 |
| 3,964,389 | 6/1976 | Peterson | 430/945 |
| 4,064,205 | 12/1977 | Landsman | 430/346 |
| 4,245,003 | 1/1981 | Oransky et al. | 430/945 |

FOREIGN PATENT DOCUMENTS

1316398  5/1973  United Kingdom .

*Primary Examiner*—Richard L. Schilling
*Attorney, Agent, or Firm*—Young & Thompson

[57] ABSTRACT

The laser imaging material comprises a laser-transparent support layer of, for example, polyester. A first overlying layer is laser-transparent and formed from a binder that is instantaneously thermally-chemically-decomposable with the production of a gas, for example, an acrylic or methacrylic homopolymer or copolymer, a cellulosic polymer, or a homopolymer or copolymer of stryene. A second overlying layer is formed from such a material, the same as or different from that of the first overlying layer, pigmented with carbon black. Upon laser irradiation through the support layer 10, selected portions of the carbon black are transferred to a suitable receptor surface such as paper or a lithographic plate.

14 Claims, 1 Drawing Figure

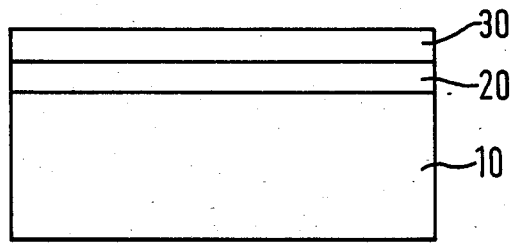

LASER IMAGING MATERIALS COMPRISING CARBON BLACK IN OVERLAYER

This invention relates to laser imaging materials and particularly concerns coated materials which are usable for forming positive and negative images by exposure, through a transparent carrier film, to radiation produced by a laser. Provided they are sufficiently opaque to ultra-violet and visible radiation, film transparencies of such negative and positive images can be used as film masters.

Film masters are commonly used in the printing industries when carrying out operations in which printing plates coated with a photosensitive composition are exposed to actinic radiation. Depending upon the nature of the composition, the radiation selectively solubilises or insolubilises the coating in the areas struck by light. Development of the resultant image is then carried out, whereby soluble material remaining in the coating as a result of the exposure is removed, usually by the action of a solvent. It is important for the image areas of film masters used for exposing printing plates to have a sufficiently high optical density in order to act as efficient photomasking materials. It is also important for those areas of the film master which are not covered by the coating to have a very low optical density to the radiation used during the exposure. The non-image areas of the film master are preferably completely transparent to the exposing radiation, so that the exposure times used can be as short as possible in practice.

Coated film materials which are suitable for imaging printing plates and/or for producing film masters by means of laser beams have been proposed. GB-A-1,385,533 discloses a method for the recording of data in visible form by directing the laser beam through a transparent film support, carrying a layer comprising a radiation-absorbing pigment such as carbon black, dispersed in a self-ignitible binder. The heat generated by absorption of the laser energy causes the layer to separate from the support in the irradiated areas. The usual procedure is to effect exposure with the coated surface in close contact with a receptor sheet, to which the coating removed by the laser is transferred. If the laser beam is modulated so as to form a positive image on the coated film, a negative image is formed on the receptor sheet and vice versa. A coated film material operating in a generally similar way is disclosed in U.S. Pat. No. 3,964,389 and comprises a transparent support carrying a coating of particles which absorb laser energy, dispersed in a mixture of a self-oxidising binder and one or more cross-linkable additives. This film material, in use, is exposed to laser energy through the transparent support while the coating is in contact with a lithographic printing surface. In the areas exposed to the laser radiation, the coating is transferred to the lithographic printing surface. The transferred coating is then rendered durable by means of heat, which causes a crosslinking agent to cure the additive(s) present. In this way, a durable lithographic printing plate is stated to be formed, which is a positive or negative of the image.

When either of the above-mentioned known film materials is used as described, transfer of the coating from the transparent substrate leaves a negative or positive transparency of the transferred image. Such transparencies can be useful in imaging photographic materials, especially litho and letterpress plates utilising photosensitive coatings. It is important to ensure when positive or negative film masters are produced in this way, for use as exposure masters for producing printing plates, that the laser beam removes the layer as cleanly and completely as possible. The efficiency of removal of the layer depends not only on the composition of the coating, but also on the power and duration of the laser exposure. A particularly useful laser source which has found extensive commercial application is the solid-state yttrium aluminium garnet or YAG laser, which produces infra-red radiation of wavelength $1.06 \times 10^{-3}$ mm (1.06 microns). A practical operating power range for YAG lasers is from 5 to 50 watts. At present, commercially available equipment for graphic arts use, usually operates over a power range of 5 to 15 watts. At such power values, scan speeds are used which result in an area of 0.2–0.5 m$^2$ undergoing exposure in a time of 2 to 5 minutes. The laser exposes the heat-sensitive coated film material by scanning it through the transparent plastics support in a helical raster pattern which may be varied in periodicity. The laser energy transmitted during the short but intense exposure is effectively absorbed at the interface between the transparent support and the layer containing IR absorbing material. The sudden generation of heat caused by this absorption thermally decomposes the layer at this interface and the gases produced in the exposed areas lift the coating from the support and allow it to transfer to a suitable receptor surface held in intimate contact with the coated surface of the film material during the exposure. The scanning laser beam can be modulated so as to form a positive or negative image, as desired.

The production of film masters in this manner suffers from the disadvantage that incomplete transfer of the layer can occur, resulting in the open areas of the film master being incompletely transparent. U.S. Pat. No. 4,245,003 describes the use of graphite instead of carbon black as the radiation-absorbing pigment, in order to overcome this difficulty. Layers containing graphite and ethyl cellulose are said to be more easily removable by the laser beam, enabling lower laser powers or faster exposure times (writing speeds) to be used. Although such graphite-containing coatings give satisfactory transfer at high scan speeds and commercially-useful laser power ratings, as shown by the acceptably low amounts of coating left on the support, as indicated by measuring its optical density, graphite can give coating with poor adhesion, cohesive strength and abrasion resistance. These defects can make such coatings difficult to handle, due to their tendency to scratch and rub off. More importantly, the lack of adhesion and abrasion resistance which such coatings may show can cause the positive and negative film masters produced to be unsuitable for use as exposure masters with printing plates, in the way desired, because of removal of the coating from the film master as a result of adhesion to or abrasion by the printing plate surface during the contact exposure operation.

The poor performance of coatings containing graphite as the radiation-absorbing pigment can be explained as follows.

The pigmented organic coating of the prior art is very thin, preferably having a thickness of 0.5 to 3.0μ, in order to be completely removable during laser exposure. It is also generally true that the thinner the coating layer, the less laser energy is required to transfer it from the film support to the receptor surface. Coatings thinner than about 0.5μ are not useful because, in practice, their optical density is not high enough for them to function as exposure masters in subsequent platemaking operations. Optical densities greater than 2.0 are required in the ultra-voilet and blue spectral regions, as the photosensitive coatings of most commercially used printing plates undergo their photochemical reactions when exposed to radiation of wavelength less than 500 nm. A lower limit to the wavelength of the radiation used for plate exposure is imposed by the absorption of wavelengths less than about 320 nm by the plate glass used in the exposure apparatus. When carbon black is used as the radiation-absorbing pigment, coatings having an approximate thickness of 1 micron can be formulated so as to have optical densities to radiation in the ultra-voilet and visible wavelength ranges in the range from 2.0 to 4.0 and such coatings are hard and have good abrasion and scratch resistance.

Graphite has a much larger particle size range than carbon black, namely 1–5$\mu$ for the finest graphite dispersions, as compared with 1–50 nm for carbon black, and so has much poorer light-stopping powder than carbon black. Consequently greater amounts must be used to give coatings with the minimum optical densities required. The much higher pigment-to-binder ratios required for graphite-based coatings compared to carbon black-based coatings can even lead to them being "under-bound", that is, insufficient binder being present to form a cohesive coating layer. Moreover, it is generally very difficult to obtain graphite dispersions having an average particle size of 1.0 micron or less, whereas it is comparatively easy to form dispersions of carbon black having an average particle size of 0.10 micron or less. Thus, in coated layers having a thickness of 1 micron, any oversize graphite particles protrude from the surface and so may readily be rubbed off the coating, causing blackening of hands and equipment and giving rise to dust problems during exposure operations.

Thus, commercially-available and other known imaging materials suffer from important disadvantages and this invention seeks to provide materials which avoid all these problems, by providing a laser removable coating on a transparent film base which has good adhesion and resistance to abrasion and is clean and trouble-free in handling. Moreover, the laser imaging materials of this invention have coatings which can be completely removed where struck by laser radiation through the transparent film base.

SUMMARY OF THE INVENTION

According to the present invention, a laser imaging material is provided, which comprises a thermally-stable transparent support, a first overlying layer which is transparent and thermally-decomposable and is carried on a surface of the support, and a second overlying layer which comprises thermally-decomposable material pigmented with carbon black and which extends over and is adhered to the first overlying layer.

DETAILED DESCRIPTION OF THE INVENTION

The first and second layers may comprise the same or different thermally-decomposable polymeric materials, but in either case it is necessary that the first layer has good adhesion to the transparent film support. A further layer may be applied over the pigmented layer, if desired, in order to provide some additional desirable property in the laser-removable composite coating comprising the superimposed layers on the film support, eg enhanced slip properties. Preferably, the total thickness of the black pigmented layer and any overlying layers shoul not exceed $3.0 \times 10^{-3}$ mm ($3.0\mu$) and most preferably not more than $2.0 \times 10^{-3}$ mm ($2.0\mu$). The black-pigmented layer desirably has a weight ratio of carbon black to thermally-decomposable binder in the range from 8:1 to 1:8; preferably 4:1 to 1:4. In practice, carbon blacks vary widely in particle size and oil absorption values, so that more specific proportions cannot be given, although in any material embodying this invention the carbon black to binder ratio is preferably selected so as to give hard abrasion-resistant coatings having an optical density greater than 2.0.

Thermally-decomposable binders which are suitable for use alone or in admixture with one another in the products of this invention include cellulosic polymers, especially nitrocellulose and ethylcellulose; acrylic and methacrylic homopolymers and copolymers; homopolymers and copolymers of styrene, particularly solution grade polystyrene polymers and copolymers. Also suitable are acrylic and methacrylic copolymers containing as monomers at least two of styrene, butadiene and acrylonitrile, and some vinyl homopolymers and copolymers. It is necessary for the suitability of the polymeric components to be established experimentally, the above list being given by way of example and not in any limiting sense.

The transparent film support is preferably dimensionally-stable. The film preferably comprises a polyester, polystyrene, PVC or polycarbonate, particularly a polyester or polycarbonate. The most preferable material is biaxially-oriented polyethylene terephthalate. Polyester film of this type is the standard film base used for photographic and photoresist products in the reprographic industries. Its high degree of dimensional stability, clarity and chemical resistance make it ideal for use in this invention. It is available in a wide variety of grades and gauges with or without adhesion promoting treatments. Suitable transparent films other than those mentioned above may also be used if desired.

The energy-sensitive coated film materials of this invention are particularly useful for use in the graphic arts fields. They may be used to form positive or negative film transparencies, proof copies or lithographic printing plates. It is of especial importance that the positive and negative film transparencies produced from the coated film materials of this invention have sufficient opacity to the passage of ultra-voilet and visible radiation to enable them to be used as film masters. Laser imaging material according to the invention can be made by a process which comprises applying transparent thermally-decomposable material to a surface of a transparent, thermally-stable support to form a first layer, and applying a thermally-decomposable material pigmented with carbon black to the first layer to form a second layer extending over and adhered to the first layer. The thermally-decomposable polymers in the pigmented and any overlying layer may be used in admixture with modifying agents, in order to improve one or other property of the layer(s). Such modifying agent may be selected from one or more of polymers, resins, dyestuffs, pigments, plasticizers, matting agents, slip agents and crosslinking agents, for instance. One particularly advantageous modifying agent is a particulate matting material such as polymethylmethacrylate beads or matting silica which prevents adhesion in use to the receptor material and the formation of Newtons rings.

The coating compositions used to form the layers may be solvent-based or water-based lacquers or dispersions, but are preferably solvent-based lacquers. It can be advantageous to use different thermally-decomposable polymers or combinations of thermally-decomposable polymers in the two (or the first two) coated layers, in order that different coating solvents may be used. By judicious selection of solvent/polymer blends, it is possible to ensure that the first layer does not redissolve the second layer before the layers are dried. However, some interfacial mingling of the two layers may occur and it may be necessary to provide it, so as to ensure good adhesion between the layers. This can usually be done by appropriate selection of the solvents used. Where polystyrene is used as the film support, the solvent(s) used for the first layer must be selected so as not to attack the polystyrene film too severely, although a limited amount of solvent etching can be useful for ensuring good adhesion between the polystyrene and the overlying coated layer.

In the laser imaging materials of the invention, the thickness of the clear and transparent first layer can be varied between wide limits but is preferably about $0.1\mu$ and $1.0\mu$. The second layer, pigmented with carbon black, preferably has a thickness of $0.5\mu$ to $2.0\mu$. These materials are useful for producing imaged transparencies by directing laser energy through the transparent support into the radiation-absorbing coating appropriately while scanning and modulating the laser beam, such process commonly being termed "laser writing". Absorption of the laser energy by the black pigment causes a very rapid rise in temperature to occur, which in turn causes the continuous phase in which the carbon particles are dispersed to undergo thermal decomposition, lifting the overlying pigmented layer and decomposing some of the underlying layer in the areas scanned by the laser. It is thought that the decomposition of the unpigmented transparent heat-decomposable layer underlying the black pigmented layer helps to ensure the substantially complete removal of the latter from the transparent support. The reasons for this are not completely understood, but it may be that, during the rapid and violent decomposition of the thermally-decomposable binder, particles of carbon black are forced on to the surface of the support at the same time as the overlying coating material is forced upwards off the support. The formation of gaseous decomposition products at the surface of the underlying unpigmented layer may oppose this effect, thereby reducing the amount of carbon left behind, and better-defined images result.

During exposure, the coated surface of the film material is held in intimate contact with a receptor sheet, to which the coating exposed to the laser beam is transferred. The receptor sheet can have an important influence on the completeness of image transfer. Best results are obtained when the receptor sheet is slightly porous or microscopically rough, so as to enable the transferred coating to embed into its surface and hence adhere firmly. Most commonly used receptor sheets are paper and anodised aluminium litho plates.

The accompanying drawing is a cross-sectional view of a laser imaging material embodying the present invention. The material comprises a transparent support layer 10 of, for example, biaxially-orientated polyethylene terephthalate, of about $75\mu$ thickness. The support layer 10 carries a first thermally-decomposable layer 20 of, for example, polystyrene and a second thermally-decomposable layer 30 of, for example, ethyl cellulose and pigmented with carbon black. The thermally-decomposable layers 20, 30 are each about $1.0\mu$ in thickness. The invention will now be described further by way of following examples of the preparation of laser imaging materials embodying the invention.

EXAMPLE 1

Polystyrene (BASF Styrol 144C) was dissolved in toluene to produce a 5% weight solution. The solution was coated onto $75\mu$ polyester film (ICI Melinex 505) with a 7 thou Mayer rod and dried to give a coating of $0.58$ g/m$^2$. A dispersion of carbon black (27 nm Furnace Black) in ethyl cellulose solution (Hercules N4) was prepared with a weight ratio of carbon black to ethyl cellulose of 4:6. The dispersion was ballmilled for 24 hours and the solids adjusted to 5% by weight with isopropanol. The dispersion was then coated onto the polystyrene-subbed polyester base and dried, to give a total dry coating weight of 1.38 g/m$^2$ and at the same time coated onto an unsubbed $75\mu$ polyester film base to give a dry coating weight of 0.86 g.m$^2$. Both coated film samples were then imaged by scanning through the uncoated side of the polyester base with a YAG laser of 8 watts power. The scan rate was 1000 lines/inch, the beam was $23\mu$ in diameter and the wavelength $1.06\mu$. During scanning the coated sides of the films were held in vacuum with an anodised aluminium receptor sheet. After scanning the areas of the film where the coating had been ablated and the carbon black transferred to the receptor sheet had their light transmission measured using a Macbeth densitometer fitted with a UV filter. The results are tabulated below:

|  | Percentage light Transmission | |
| --- | --- | --- |
|  | Before Ablation | After Ablation |
| Sample A with polystyrene sub | approx 0.1% | 40% |
| Sample B no sub | approx 0.1% | 29% |

When the negatives derived from scanning, Sample A and Sample B were used to expose UV sensitive photopolymer coating the exposure times were found to be in close accordance with the open area transmission densities but the negative obtained from the unsubbed coating required exposure times 15–20% longer than the negative incorporating the polystyrene sub. In both cases the negatives had hard glossy surfaces in the unablated areas which were not prone to soiling but the negative incorporating the polystyrene sub had far better coating adhesion and abrasion resistance.

EXAMPLE 2

A 10% by weight solution of nitrocellulose (ICI Ltd. DHM 10-25) in a 2:1 mixture of n-butyl acetate and xylene was coated on to $75\mu$ polyester (Melinex 542) film base using a 20 thou Mayer rod, and dried. A black-pigmented coating lacquer was prepared by dispersing Microlith Black C-A (Ciba Geigy) and Surcol 860 (an acrylic copolymer resin) (Allied Colloids Ltd) in 99% IMS so as to give a solution containing 5% by weight of each component. Using a 7 thou Mayer rod, this solution was then used to coat the previously prepared nitrocellulose subbed polyester film, and at the same time an identical sample of unsubbed film base. The coating weight of the pigmented coating was approximately 0.9 gm$^2$.

The coatings were scanned under the same conditions as described in Example 1. After ablation, the transmission of the coated film and the areas of the film from which coating had been removed were measured as in Example 1 and gave the following results:

|  | Percentage light Transmission | |
| --- | --- | --- |
|  | Before Ablation | After Ablation |
| Sample A with NC sub | ~0.1% | 40% |
| Sample B without NC sub | ~0.1% | 31% |

When used in subsequent exposure operations with UV sensitive photopolymer coatings, negatives produced from the nitrocellulose subbed film required approx 10% shorter exposure times.

EXAMPLE 3

A 10% by weight solution of polyethylmethacrylate (Cole Polymers Ltd Colacryl P1101) in 1:1 MIBK/Toluene was coated onto Melinex 505 film base using a 10 thou Mayer rod. The black pigmented coating lacquer of Example 1 was coated on top of the subbed base and a sample of unsubbed base was coated at the same time. The coatings were then scanned with the 8 watt YAG laser under identical conditions to those of Examples 1 and 2. The results of transmission tests identical to those of Examples 1 and 2 are shown below:

|  | Percentage light Transmission | |
| --- | --- | --- |
|  | Before Ablation | After Ablation |
| Sample A | ~0.1% | 46% |
| Sample B | ~0.1% | 30% |

Exposure times were approx 20% shorter using the negative produced from the subbed film and the coating was hard with good adhesion and abrasion resistance.

It is evident that those skilled in the art will make numerous modifications of the specific embodiments and Examples described without departing from the present invention concepts. It is accordingly intended that the invention shall be construed as embracing each and every novel feature and novel combination of features present in or possessed by the materials and the methods of their production described herein and that the foregoing disclosure shall be read as illustrative and not as limiting except to the extent set forth in the claims appended hereto.

Typical modifications include the use of materials of the types mentioned hereinbefore, for example methylmethacrylate: polystyrene copolymer, as the polymeric materials of the first and second overlying layers.

We claim:

1. A laser imaging material comprising a thermally-stable transparent support, a first overlying layer which is transparent and is instantaneously thermally-chemically-decomposable with the production of a gas and is carried on a surface of the support, and a second overlying layer which comprises a material that is instantaneously thermally-chemically-decomposable with the production of a gas and that is pigmented with carbon black and which extends over and is adhered to the first overlying layer.

2. A laser imaging material according to claim 1, in which the support is a polyester film.

3. A laser imaging material according to claim 2, in which the support is biaxially-orientated polyethylene terephthalate.

4. A laser imaging material according to claim 1, in which at least one of the first and second overlying layers comprises a cellulosic polymer.

5. A laser imaging material according to claim 4, in which the polymer is nitrocellulose or ethylcellulose.

6. A laser imaging material according to claim 1, in which at least one of the first and second overlying layers comprises at least one polymeric material selected from acrylic homopolymers and copolymers, methacrylic homopolymers and copolymers, and homopolymers and copolymers of styrene.

7. A laser imaging material according to claim 1, in which at least one of the first and second overlying layers comprises at least one polymeric material selected from acrylic and methacrylic copolymers containing at least two of styrene, butadiene and acrylonitrile.

8. A laser imaging material according to claim 1, in which the weight ratio of carbon black to thermally-decomposable material in the second overlying layer is in the range of from about 8:1 to about 1:8.

9. A laser imaging material according to claim 8, in which the weight ratio is in the range of from about 4:1 to about 1:4.

10. A laser imaging material according to claim 1, in which the first overlying layer is between about $0.1\mu$ and about $1.0\mu$ in thickness.

11. A laser imaging material according to claim 1, in which the second overlying layer is between about $0.5\mu$ and about $0.2\mu$ in thickness.

12. A laser imaging material according to claim 1, in which at least one of the first and second overlying layers comprises at least one polymeric material selected from vinyl homopolymers and copolymers.

13. A laser imaging material according to claim 6, in which at least one of the first and second overlying layers comprises a copolymer of methylmethacrylate and styrene.

14. A laser imaging material according to claim 1, in which one of the first and second overlying layers comprises a cellulosic polymer and the other of the first and second layers comprises at least one polymeric material selected from acrylic homopolymers and copolymers, methacrylic homopolymers and copolymers, and homopolymers and copolymers of styrene.

* * * * *